(12) United States Patent
Koike

(10) Patent No.: US 7,544,555 B2
(45) Date of Patent: Jun. 9, 2009

(54) METHOD OF MANUFACTURING SEMICONDUCTOR DEVICE

(75) Inventor: Osamu Koike, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 157 days.

(21) Appl. No.: 11/708,045

(22) Filed: Feb. 20, 2007

(65) Prior Publication Data

US 2007/0275528 A1    Nov. 29, 2007

(30) Foreign Application Priority Data

Mar. 31, 2006   (JP) .............................. 2006-098140

(51) Int. Cl.
  *H01L 21/336* (2006.01)
  *H01L 21/8234* (2006.01)
(52) U.S. Cl. ...................... 438/197; 438/199; 438/275; 257/369
(58) Field of Classification Search ................. 438/197, 438/199, 275, 299, 303, 306, 592; 257/E21.205, 257/E21.624, E21.638, E21.409, E21.449
  See application file for complete search history.

(56) References Cited

U.S. PATENT DOCUMENTS

| 5,960,288 | A | * | 9/1999 | Hong et al. | 438/275 |
| 6,436,747 | B1 | * | 8/2002 | Segawa et al. | 438/197 |
| 6,541,823 | B1 | * | 4/2003 | Yoshiyama et al. | 257/351 |
| 7,148,097 | B2 | * | 12/2006 | Yu et al. | 438/199 |
| 2006/0105557 | A1 | * | 5/2006 | Klee et al. | 438/592 |

FOREIGN PATENT DOCUMENTS

JP    2003060067    2/2003

* cited by examiner

*Primary Examiner*—Theresa T Doan
(74) *Attorney, Agent, or Firm*—Volentine & Whitt, P.L.L.C.

(57) ABSTRACT

A dummy oxide film having a film thickness that is the same as that of a gate oxide film of a high voltage transistor is formed on a gate electrode of a transistor, and the dummy oxide film and the gate oxide film formed on a substrate surface are removed at the same time during etching for spacer formation. Thus, it becomes possible to stably form a spacer width that sufficiently satisfies device characteristics when manufacturing a semiconductor device where a low voltage transistor and a high voltage transistor are formed on the same semiconductor substrate.

4 Claims, 9 Drawing Sheets

FORMATION OF Co

F I G. 1
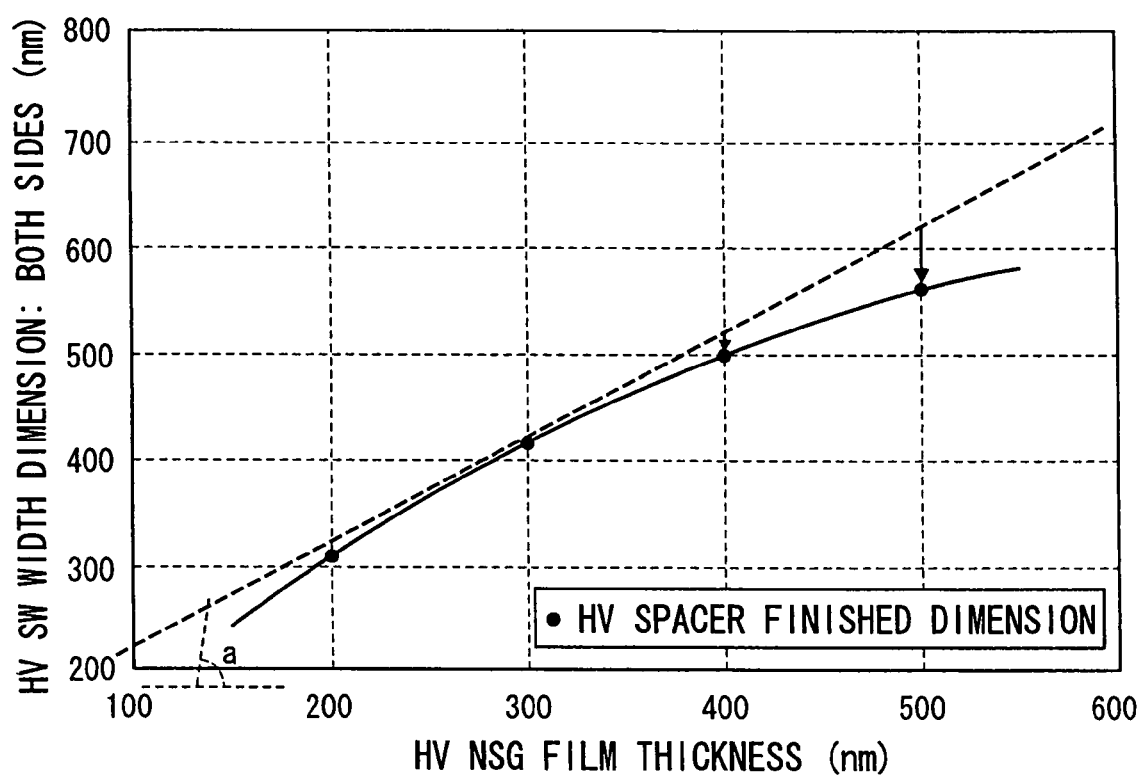

SPACER FILM THICKNESS = 200nm

SPACER FILM THICKNESS = 300nm

SPACER FILM THICKNESS = 400nm

SPACER FILM THICKNESS = 500nm

AFTER FORMATION OF SPACER FILM

SPACER IS ETCHED

AFTER FORMATION OF SPACER

AFTER FORMATION OF SPACER FILM

SPACER IS ETCHED

AFTER FORMATION OF SPACER

FORMATION OF PolySi/ OXIDE FILM

PHOTOLITHOGRAPHY/ ETCHING OF GATE

FIRST IMPURITY IMPLANTATION 1

FORMATION OF LV SiN

FORMATION OF HV NSG

ETCHING OF HV NSG

REMOVAL OF LV PORTION HV NSG

FORMATION OF LV SPACER

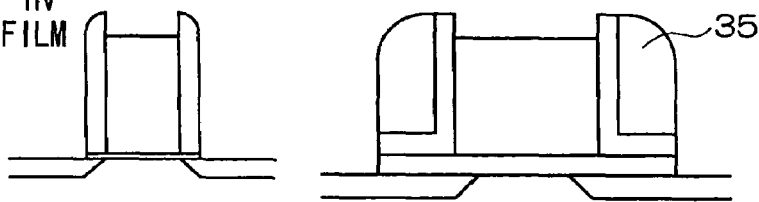
FIG. 5I ETCHING OF HV GATE OXIDE FILM
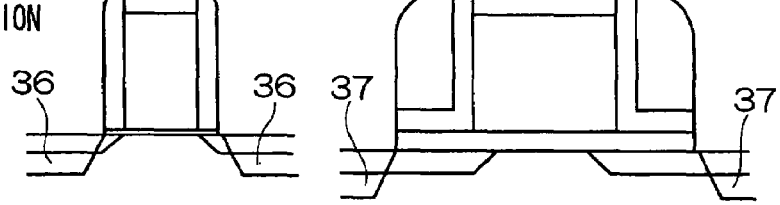
FIG. 5J SECOND IMPURITY IMPLANTATION
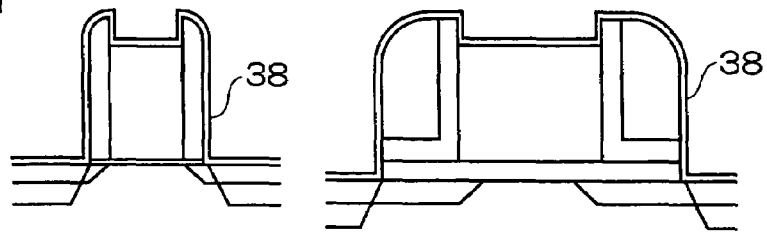
FIG. 5K FORMATION OF Co
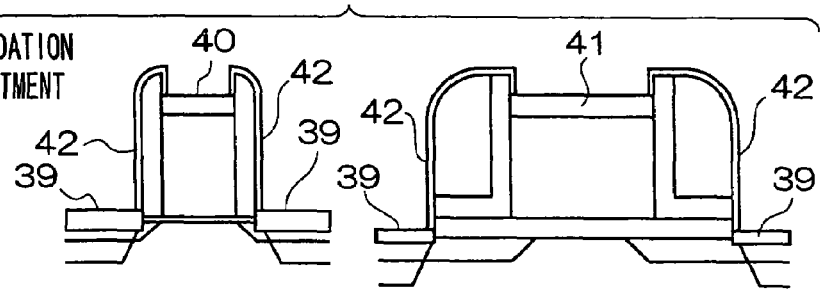
FIG. 5L Co SILICIDATION HEAT TREATMENT
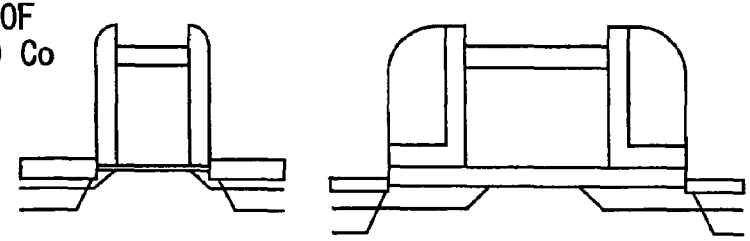
FIG. 5M REMOVAL OF UNREACTED Co

ETCHING OF HV GATE OXIDE FILM

SECOND IMPURITY IMPLANTATION

FORMATION OF Co

Co SILICIDATION HEAT TREATMENT

REMOVAL OF UNREACTED Co

METHOD OF MANUFACTURING SEMICONDUCTOR DEVICE

CROSS-REFERENCE TO RELATED APPLICATION

This application claims priority under 35 USC 119 from Japanese Patent Application No. 2006-098140, the disclosure of which is incorporated by reference herein.

BACKGROUND OF THE INVENTION

1. Field of the Invention

The present invention relates to a method of manufacturing a semiconductor device, and in particular to a method of manufacturing a semiconductor device where a low voltage transistor that operates at a low operating voltage and a high voltage transistor that operates at a higher operating voltage than the low operating voltage are formed on the same semiconductor substrate.

2. Description of the Related Art

In a low voltage transistor that operates at a relatively low operating voltage (also called a low withstand voltage transistor), it is necessary to lower the resistance of the source/drain regions in order to improve the operating speed of the transistor. And in order to lower the resistance of the source/drain regions, it is necessary to shorten the length of the low concentration diffusion region of the transistor.

In a high voltage transistor that operates at a higher operating voltage than the low operating voltage (also called a high withstand voltage transistor), it is necessary to alleviate the electric field that arises in the end portion of the drain region in order to control deterioration of hot-carrier transistor characteristics. And in order to alleviate the electric field that arises in the end portion of the drain region, it is necessary to lengthen the length of the low concentration diffusion region of the transistor.

The length of the low concentration diffusion region of a transistor is dependent on the width of a side wall spacer formed on a side wall of a gate electrode. Consequently, in a semiconductor device where a low voltage transistor and a high voltage transistor are formed on the same semiconductor substrate, how a side wall spacer having a width corresponding to the characteristics of each transistor can be precisely formed is becoming important.

Japanese Patent Application Publication (JP-A) No. 2003-60067 discloses relatively shortening the width of an LDD region by forming a single layer spacer on the side wall of a gate electrode of a low voltage transistor. JP-A 2003-60067 also discloses relatively enlarging the width of the LDD region and alleviating the electric field at the drain end portion by forming a two layer spacer on the side wall of a gate electrode of a high voltage transistor.

Further, in recent years, where there is a demand for even higher speed operation of semiconductor devices, it has become common to apply the silicide process, where Ti silicide or Co silicide is formed on the gate electrode and the source/drain regions of a transistor, to semiconductor devices to lower the resistance of the gate electrode and the source/drain regions of the transistor. It will be noted that JP-A No. 2003-60067 also discloses that the silicide process is applied to a semiconductor device.

However, the present inventors have discovered that there is room for improvement in the above semiconductor devices in terms of the following points.

In a semiconductor device to which the silicide process is applied, it is necessary for the top surface of the gate electrode of a transistor configured by PolySi to be exposed. This is because it is necessary for Co to be directly formed on Si or PolySi in order for silicidation of Co to occur.

In FIG. 1, the relationship between the film thickness of a side wall spacer film and the dimension (width) of a side wall spacer is shown. As shown in FIG. 1, there is a tendency for the spacer dimension to not increase linearly with respect to an increase in the film thickness of the spacer film and for the amount of increase in the spacer dimension to decrease together with an increase in the spacer film thickness. As shown in FIG. 2, it will be understood that there is a tendency for the angle represented by symbol "a" to become gentler in accompaniment with an increase in the film thickness of the spacer film.

In FIG. 3 and FIG. 4, the mechanism of reduction of the spacer dimension increase amount accompanying the spacer film thickness increase is shown. As shown in (A) of FIG. 3, when the spacer film shape in the vicinity of the gate electrode after formation of the spacer film is close to a vertical shape, then the spacer shown in (B) of FIG. 3 is formed without the spacer dimension changing during spacer etching. In contrast, as shown in (A) of FIG. 4, when the spacer film shape in the vicinity of the gate electrode after formation of the spacer film is gentle, then as shown in (B) of FIG. 4, a reduction of the spacer dimension occurs in accompaniment with etching. As a result, it becomes difficult to ensure a spacer width that sufficiently satisfies device characteristics.

Further, because the spacer width changes due to the amount of etching, it is conceivable to deposit a hard mask or the like on the top surface of the gate electrode and substantially increase the film thickness of the gate electrode formation portion in order to stably increase the spacer width. However, in a semiconductor device to which the silicide process is applied, it is necessary for the top surface of a gate electrode configured by PolySi to be exposed during Co film formation. That is, when a hard mask is used, the step of removing the hard mask becomes necessary during Co film formation. Thus, from the standpoint of optimizing steps, it is not preferable to use a hard mask just for the purpose of stably increasing the spacer width.

As described above, in a case where the silicide process is applied when manufacturing a semiconductor device where a low voltage transistor and a high voltage transistor are formed on the same semiconductor substrate, it is necessary for the top surface of the gate electrode to be exposed after spacer etching. Thus, there have been points for improvement in that it has been impossible to increase the film thickness of the gate electrode formation portion using a hard mask or the like and it has been difficult to stably form a spacer width that sufficiently satisfies device characteristics.

SUMMARY OF THE INVENTION

The present invention has been made in order to overcome this problem. The invention disclosed in this application includes:

forming first and second active regions on a semiconductor substrate surface;

forming a first gate insulation film including a first thickness on the first active region;

forming a second gate insulation film including a second thickness on the second active region;

forming gate electrode material on the first and second gate insulation films;

forming hard mask material including the first thickness on the gate electrode material;

patterning the hard mask material to cause a first hard mask pattern to remain on the gate electrode material positioned on the first active region and to cause a second hard mask pattern to remain on the gate electrode material positioned on the second active region;

patterning the gate electrode material using the first and second hard mask patterns as a mask to form a first gate electrode on the first active region and to form a second gate electrode on the second active region;

forming a first insulation film on the first and second active regions;

forming a second insulation film on the first insulation film;

etching the second insulation film to form a first side wall spacer on side walls of the first and second gate electrodes;

removing the first side wall spacer formed on the side wall of the second gate electrode;

etching the first insulation film to expose the first and second hard mask patterns, form a second side wall spacer comprising the first and second insulation films on the side wall of the first gate electrode, and form a third side wall spacer comprising the first insulation film on the side wall of the second gate electrode;

etching and removing the first and second hard mask patterns and the first and second gate insulation films; and forming a metal film on the surfaces of the first and second gate electrode and on the surfaces of the first and second active regions.

According to the present invention, it becomes possible to form a silicide on a gate electrode while stably forming a spacer width.

BRIEF DESCRIPTION OF THE DRAWINGS

Preferred exemplary embodiments of the present invention will be described in detail based on the following figures, wherein:

FIG. 1 is a diagram showing the relationship between the film thickness of a side wall spacer film and the dimension (width) of a side wall spacer;

FIG. 5I is a process diagram showing the first exemplary embodiment of the present invention;

FIG. 5J is a process diagram showing the first exemplary embodiment of the present invention;

FIG. 5K is a process diagram showing the first exemplary embodiment of the present invention;

FIG. 5L is a process diagram showing the first exemplary embodiment of the present invention;

FIG. 5M is a process diagram showing the first exemplary embodiment of the present invention;

DETAILED DESCRIPTION OF THE INVENTION

First Exemplary Embodiment

Figure 2:
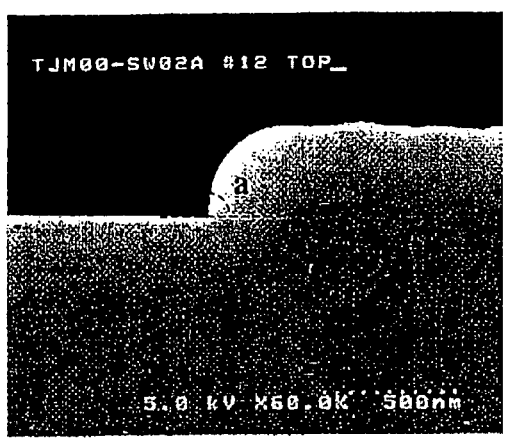
FIG. 2 is a diagram showing the relationship between the film thickness of a spacer film and the shape of the spacer film after formation.
Figure 2:
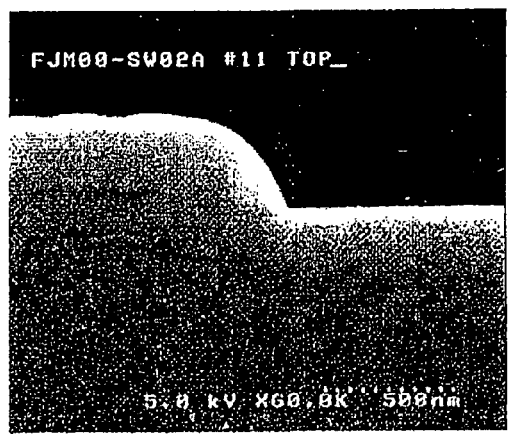
Figure 2:
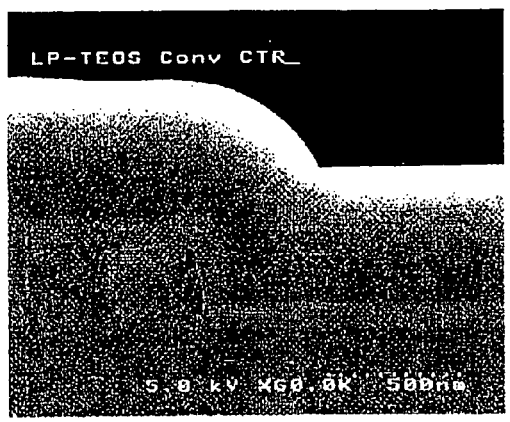
Figure 2:
Figure 3:
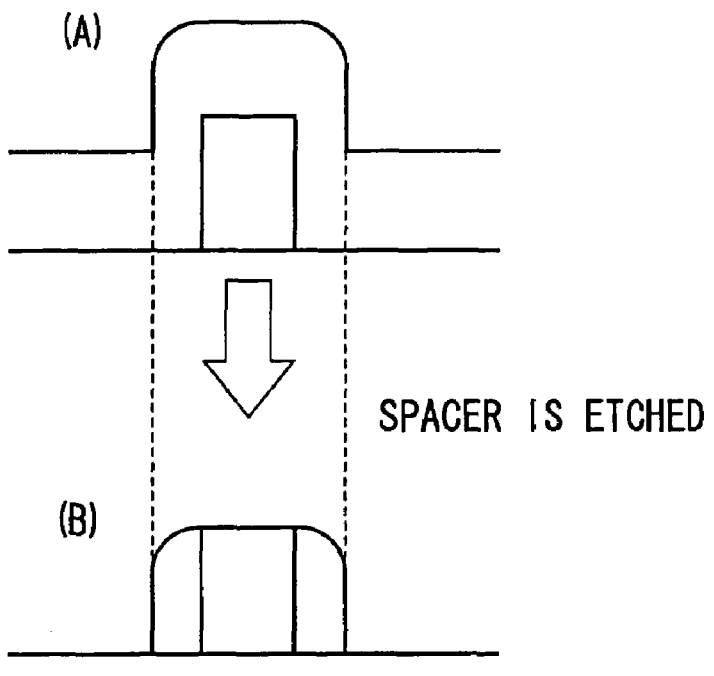
FIG. 3 is a diagram showing the mechanism of reduction of spacer dimension increase amount accompanying spacer film thickness increase.
Figure 4:
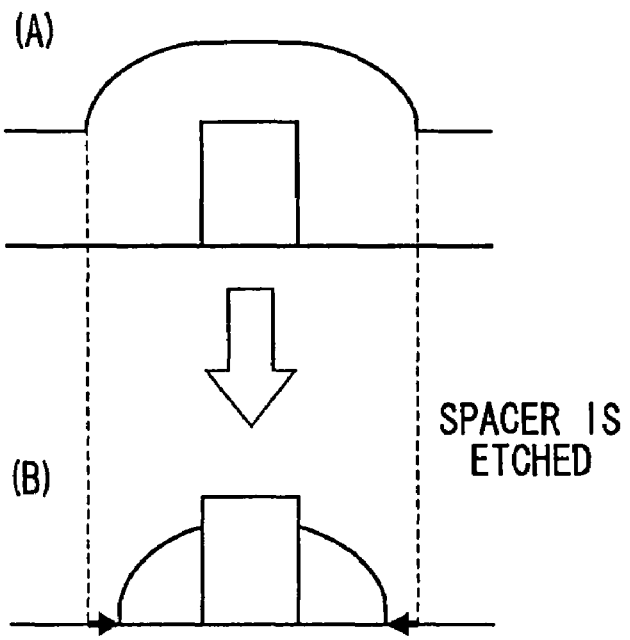
FIG. 4 is a diagram showing the mechanism of reduction of spacer dimension increase amount accompanying spacer film thickness increase.

FIGS. 5A to 5M show a sequence from gate formation to suicide formation of the present invention.

In the drawings, the configuration shown on the left side is a low voltage transistor that operates at a low operating voltage, and the configuration shown on the right side is a high voltage transistor that operates at a higher operating voltage than the low operating voltage. These two types of transistors are formed on the same semiconductor substrate. It will be noted that the letters "LV" used throughout this specification and in the drawings are an abbreviation for "low voltage" and means that the configuration is one relating to the low voltage transistor that operates at a low operating voltage, and the letters "HV" are an abbreviation for "high voltage" and means that the configuration is one relating to the high voltage transistor that operates at a higher operating voltage than the low operating voltage.

Figure 5A:
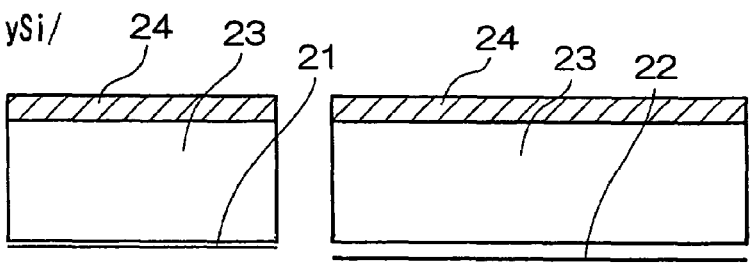
FIG. 5A is a process diagram showing a first exemplary embodiment of the present invention.

First, PolySi 23 and a dummy oxide film 24 are formed on a LV oxide film 21 and a HV oxide film 22. Here, the film thickness of the dummy oxide film 24 is the same as that of the HV oxide film 22 (FIG. 5A).

Figure 5B:
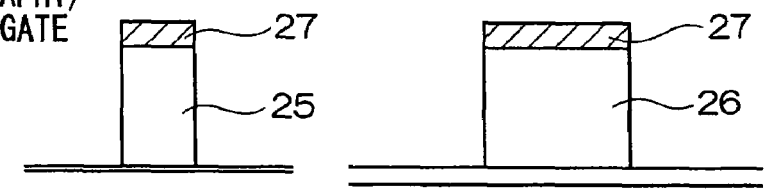
FIG. 5B is a process diagram showing the first exemplary embodiment of the present invention.

Next, photolithography and etching are performed, patterning of the PolySi 23 and the dummy oxide film 24 is performed, and a LV portion transistor gate 25, a HV portion transistor gate 26, and an on-transistor dummy oxide film 27 are formed (FIG. 5B).

Figure 5C:
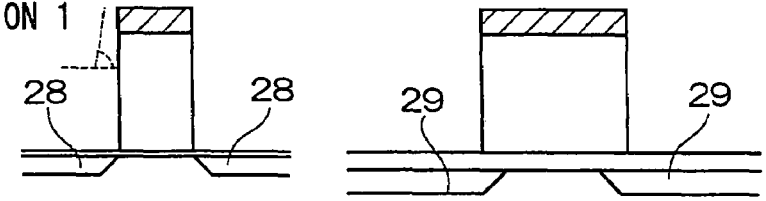
FIG. 5C is a process diagram showing the first exemplary embodiment of the present invention.

Next, impurity implantation is performed using the LV portion transistor gate 25, the HV portion transistor gate 26, and the on-transistor dummy oxide film 27 as a mask, and a LV portion N−/P− 28 and a HV portion N−/P− 29 are formed (FIG. 5C).

Figure 5D:
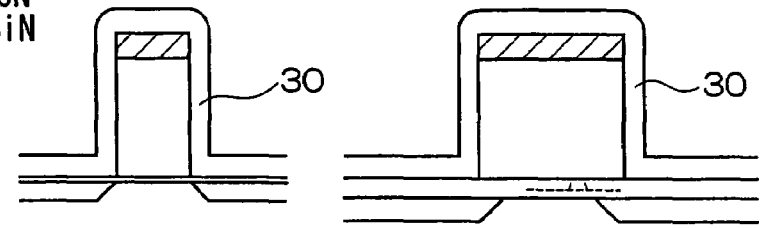
FIG. 5D is a process diagram showing the first exemplary embodiment of the present invention.

Next, LV SiN 30 is formed on the entire surface of the wafer (FIG. 5D).

Figure 5E:
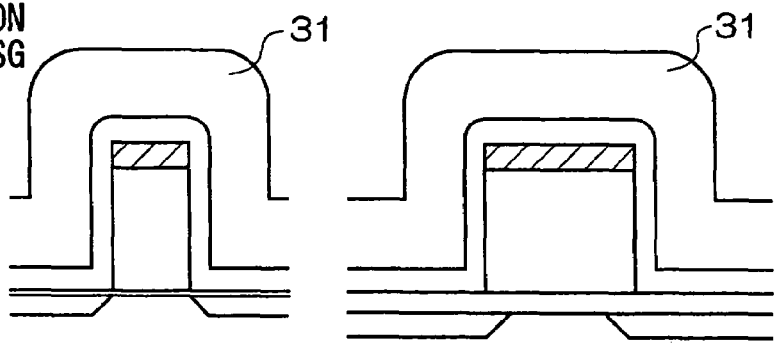
FIG. 5E is a process diagram showing the first exemplary embodiment of the present invention.

Next, HV NSG 31 is formed on the entire surface of the wafer (FIG. 5E).

Figure 5F:
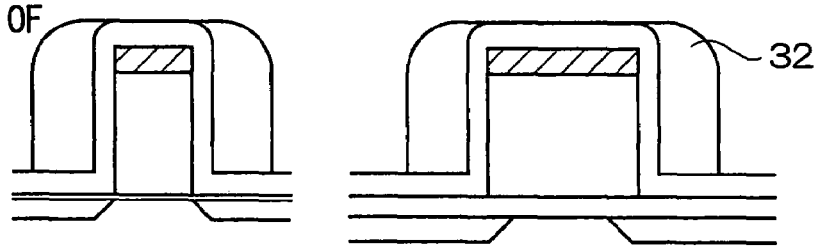
FIG. 5F is a process diagram showing the first exemplary embodiment of the present invention.

Next, etching of the HV NSG 31 is performed, and etching is selectively stopped above the LV SiN 30. At this time, a HV spacer 1 32 is formed on the HV portion (FIG. 5F).

Figure 5G:
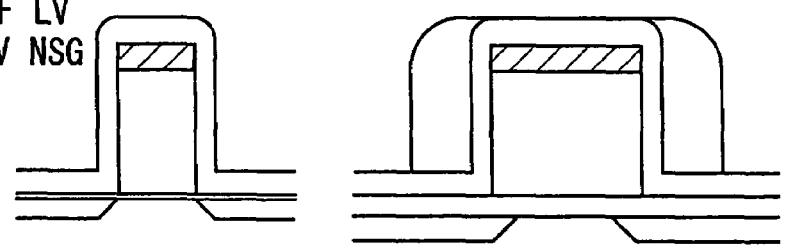
FIG. 5G is a process diagram showing the first exemplary embodiment of the present invention.

Next, photolithography and etching are performed, and the HV NSG 31 of the LV portion is removed (FIG. 5G).

Figure 5H:
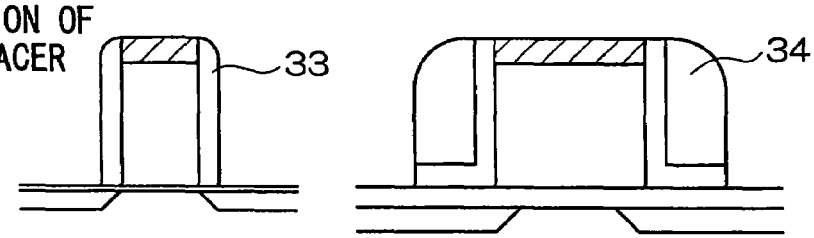
FIG. 5H is a process diagram showing the first exemplary embodiment of the present invention.

Next, the LV SiN 30 is etched and a LV spacer 33 is formed on the LV portion. Further, with respect to the HV portion, etching of the LV SiN 30 is performed using the HV spacer 1 32 as a mask, and a HV spacer 2 34 is formed (FIG. 5H).

Next, oxide film etching is performed, the HV oxide film 22 is removed, and a HV spacer 35 is formed. At this time, the dummy oxide film 24 is removed at the same time as the HV oxide film 22, and the surfaces of the LV portion transistor gate 25 and the HV portion transistor gate 26 are exposed (FIG. 5I).

Next, impurity implantation is performed using the LV portion transistor gate 25, the HV portion transistor gate 26, the LV spacer 33, and the HV spacer 35 as a mask, and a LV portion N+/P+ 36 and a HV portion N−/P− 37 are formed (FIG. 5J).

Next, Co 38 is formed on the entire wafer surface (FIG. 5K).

Next, heat treatment is performed, silicidation of the Co 38 is performed, and an on-Si Co silicide 39, an on-LV portion transistor gate Co silicide 40, and an on-HV portion transistor gate Co silicide 41 are formed. Further, the Co 38 not contacting the Si and LV portion transistor gate 25 and the HV portion transistor gate 26 becomes unreacted Co 42 (FIG. 5L).

Next, removal of the unreacted Co 42 is performed (FIG. 5M).

Next, the effects of the present invention will be described. In a semiconductor device to which the conventional silicide process is applied, a silicide is formed on PolySi that is the gate electrode of the transistor, so it has been impossible to sufficiently ensure the height of the gate electrode portion, it has been difficult for HV-NSG to be formed gently and to ensure a spacer width that sufficiently satisfies device characteristics, and the spacer width has also changed due to the etching amount. However, according to the present invention, a dummy oxide film with the same film thickness as that of the HV gate oxide film is formed on the transistor gate, and the HV gate oxide film and the dummy oxide film on the transistor gate are etched at the same time during HV gate oxide film etching in the spacer etching, whereby a film thickness to which has been added the dummy oxide film and the PolySi film thickness of the transistor gate can be used in spacer formation, and it becomes possible to form Co silicide on PolySi while stably forming a spacer width.

Second Exemplary Embodiment

FIGS. 6A to 6M show a sequence from gate formation to silicide formation of a second exemplary embodiment.

Figure 6A:
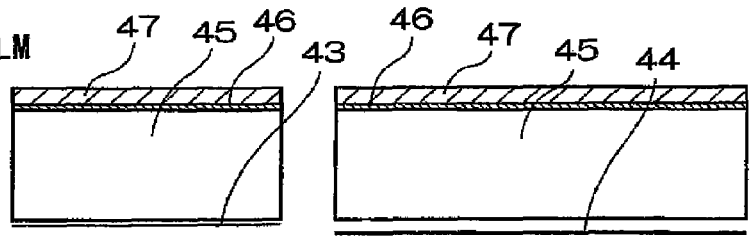
FIG. 6A is a process diagram showing a second exemplary embodiment of the present invention.

First, PolySi 45 is formed on a LV oxide film 43 and a HV oxide film 44, and dummy SiN 46 and a dummy oxide film 47 are formed on the PolySi 45. Here, the film thickness of the dummy SiN 46 and the dummy oxide film 47 is formed as a film thickness that can be etched in the same amount of time as the amount of time necessary to etch the HV oxide film 44 (FIG. 6A).

Figure 6B:
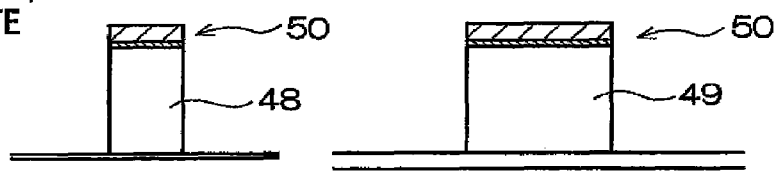
FIG. 6B is a process diagram showing the second exemplary embodiment of the present invention.

Next, photolithography and etching are performed, patterning of the PolySi 45, the dummy SiN 46, and the oxide film 47 is performed, and a LV portion transistor gate 48, a HV portion transistor gate 49, and an on-transistor gate dummy oxide film/dummy SiN 50 are formed (FIG. 6B).

Figure 6C:
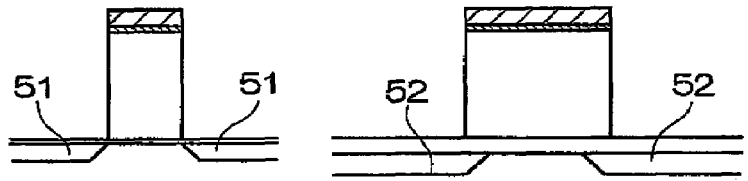
FIG. 6C is a process diagram showing the second exemplary embodiment of the present invention.

Next, impurity implantation is performed using the LV portion transistor gate 48, the HV portion transistor gate 49, and the on-transistor gate dummy oxide film/dummy SiN 50 as a mask, and a LV portion N−/P− 51 and a HV portion N−/P− 52 are formed (FIG. 6C).

Figure 6D:
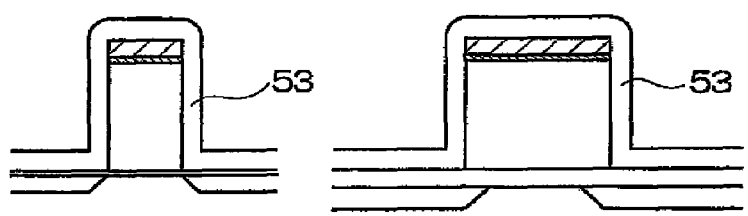
FIG. 6D is a process diagram showing the second exemplary embodiment of the present invention.

Next, LV SiN 53 is formed on the entire surface of the wafer (FIG. 6D).

Figure 6E:
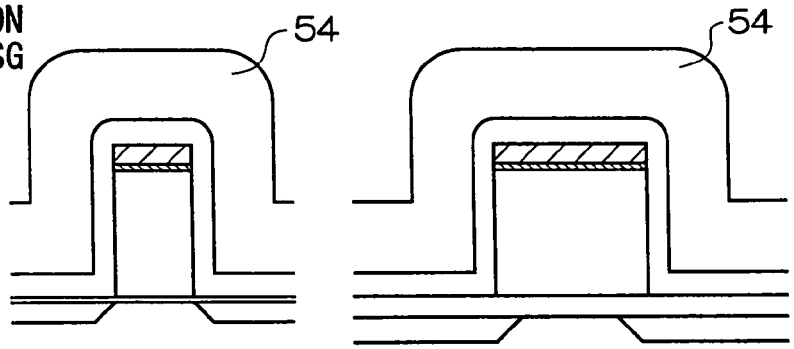
FIG. 6E is a process diagram showing the second exemplary embodiment of the present invention.

Next, HV NSG 54 is formed on the entire surface of the wafer (FIG. 6E).

Figure 6F:
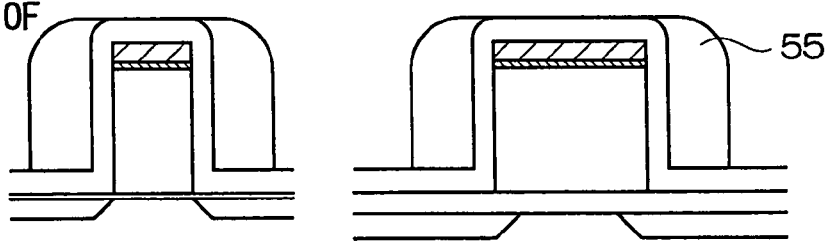
FIG. 6F is a process diagram showing the second exemplary embodiment of the present invention.

Next, etching of the HV NSG 54 is performed, and etching is selectively stopped above the LV SiN 53. At this time, a HV spacer 1 55 is formed on the HV portion (FIG. 6F).

Figure 6G:
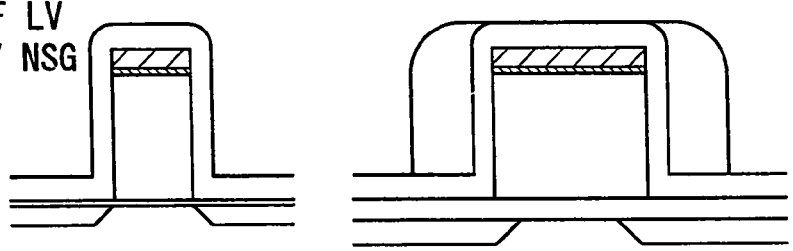
FIG. 6G is a process diagram showing the second exemplary embodiment of the present invention.

Next, photolithography and etching are performed, and the HV NSG 54 of the LV portion is removed (FIG. 6G).

Figure 6H:
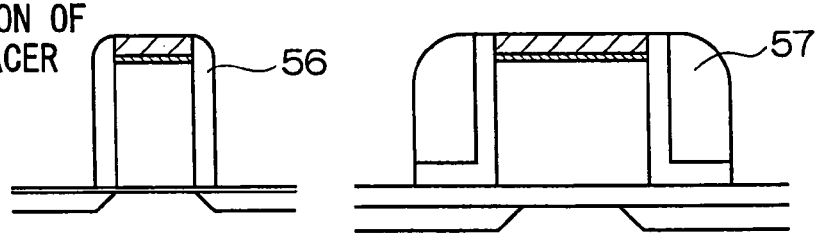
FIG. 6H is a process diagram showing the second exemplary embodiment of the present invention.

Next, the LV SiN 53 is etched using the spacer 1 55 as a mask and a HV spacer 2 57 is formed (FIG. 6H).

Figure 6I:
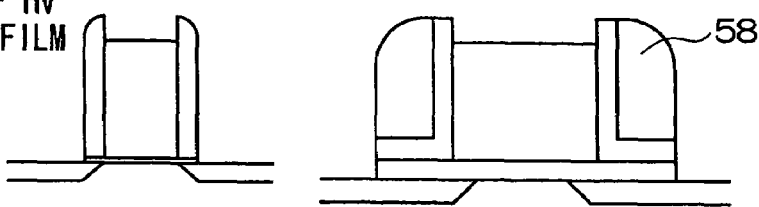
FIG. 6I is a process diagram showing the second exemplary embodiment of the present invention.

Next, oxide film etching is performed, the HV oxide film 44 is removed, and a HV spacer 57 is formed. At this time, the on-transistor gate dummy oxide film/dummy SIN 50 is removed at the same time as the HV oxide film 44, and the surfaces of the LV portion transistor gate 48 and the HV portion transistor gate 49 are exposed (FIG. 6I).

Figure 6J:
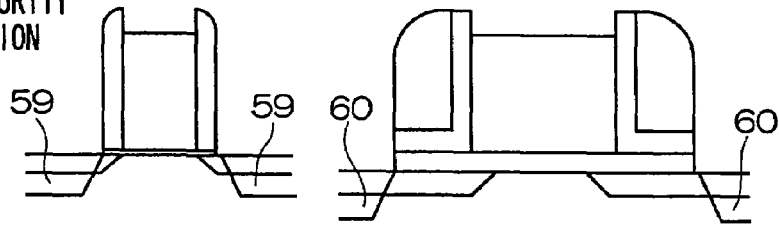
FIG. 6J is a process diagram showing the second exemplary embodiment of the present invention.
Figure 6K:
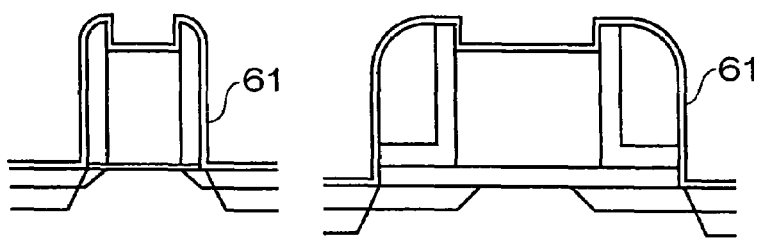
FIG. 6K is a process diagram showing the second exemplary embodiment of the present invention.

Next, impurity implantation is performed using the LV portion transistor gate 48, the HV portion transistor gate 49, the LV spacer 56, and the HV spacer 58 as a mask, and a LV portion N+/P+ 59 and a HV portion N−/P− 60 are formed (FIG. 6J).

Figure 6L:
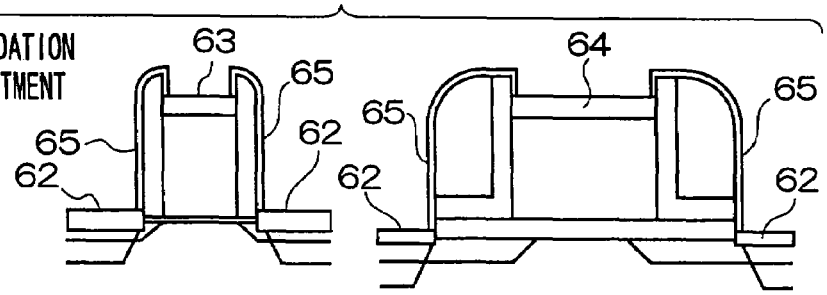
FIG. 6L is a process diagram showing the second exemplary embodiment of the present invention.

Next, heat treatment is performed, silicidation of the Co 61 is performed, and an on-Si Co silicide 62, an on-LV portion transistor gate Co silicide 63, and an on-HV portion transistor gate Co silicide 64 are formed. Further, the Co 61 not contacting the Si and LV portion transistor gate 48 and the HV portion transistor gate 49 becomes unreacted Co 65 (FIG. 6L).

Figure 6M:
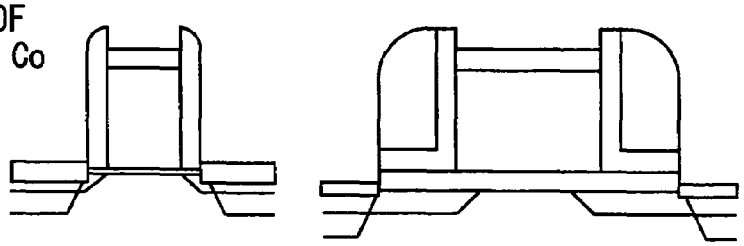
FIG. 6M is a process diagram showing the second exemplary embodiment of the present invention.

Next, removal of the unreacted Co 65 is performed (FIG. 6M).

Next, the effects of the present invention will be described. In the first exemplary embodiment, the dummy oxide film 24 was formed on the transistor gate and etching was performed at the same time as the HV oxide film 22 (see FIG. 5I). In this case, a method of detecting the end of etching by emission spectroscopy during oxide film removal is used, but excessive etching is imparted to the Si substrate because endpoint determination is performed after the top of the Si substrate is exposed, and damage to the Si substrate and implantation of the carbon being used during etching into the Si substrate occur. There has been concern that this damage to the Si substrate and implantation of the carbon being used during etching into the Si substrate will cause deterioration of the performance of the semiconductor device.

In the second exemplary embodiment, it becomes possible to perform endpoint determination when etching of the dummy oxide film 47 ends—that is, it becomes possible to perform endpoint determination before the HV oxide film 22 is completely removed—by forming the dummy SiN 46 and the dummy oxide film 47 on the transistor gate. Thus, in the second exemplary embodiment, the dummy SiN 46 and the dummy oxide film 47 that can be etched in the same amount of time as the amount of time necessary to etch the HV oxide film 44 are formed on the transistor gate, and the HV gate oxide film and the dummy oxide film/SiN 50 on the transistor gate are etched at the same time during HV gate oxide film etching in spacer etching, whereby a film thickness to which has been added the dummy oxide film and the PolySi film thickness of the transistor gate can be used for spacer formation while controlling damage to the Si substrate and implantation of carbon into the Si substrate, and it becomes possible to form Co silicide on PolySi while stably forming a spacer width.

What is claimed is:

1. A method of manufacturing a semiconductor device comprising:

forming first and second active regions on a semiconductor substrate surface;

forming a first gate insulation film having a first thickness on the first active region;

forming a second gate insulation film having a second thickness on the second active region;

forming gate electrode material on the first and second gate insulation films;

forming hard mask material having the first thickness on the gate electrode material;

patterning the hard mask material to cause a first hard mask pattern to remain on the gate electrode material positioned on the first active region and to cause a second hard mask pattern to remain on the gate electrode material position on the second active region;

patterning the gate electrode material using the first and second hard mask patterns as a mask to form a first gate electrode on the first active region and to form a second gate electrode on the second active region;

forming a first insulation film on the first and second active regions;

forming a second insulation film on the first insulation film;

etching the second insulation film to form a first side wall spacer on side walls of the first and second gate electrodes;

removing the first side wall spacer formed on the side wall of the second gate electrode;

etching the first insulation film to expose the first and second hard mask patterns, form a second side wall spacer comprising the first and second insulation films on the side wall of the first gate electrode, and form a third side wall spacer comprising the first insulation film on the side wall of the second gate electrode;

etching and removing the first and second hard mask patterns and the first and second gate insulation films simultaneously; and forming a metal film on the surfaces of the first and second gate electrode and on the surfaces of the first and second active regions.

2. The semiconductor device manufacturing method of claim 1, wherein the first thickness of the hard mask material is set to a thickness where the first and second hard mask patterns and the first gate insulation film are etched and removed at the same time.

3. The semiconductor device manufacturing method of claim 1, wherein the first thickness of the first gate insulation film is thicker than the second thickness of the second gate insulation film.

4. The semiconductor device manufacturing method of claim 1, wherein the first gate electrode is a gate electrode of a high voltage transistor that operates at a relatively high operating voltage, and the second gate electrode is a gate electrode of a low voltage transistor that operates at a relatively low operating voltage.

* * * * *